United States Patent [19]

Dietrich et al.

[11] Patent Number: 5,029,555

[45] Date of Patent: Jul. 9, 1991

[54] WAFER HOLDER METHOD AND APPARATUS IN A VACUUM DEPOSITION SYSTEM

[75] Inventors: Hans P. Dietrich, Adliswil; Hanspeter Ott, Thalwil; David J. Webb, Ruschlikon, all of Switzerland

[73] Assignee: International Business Machines Corporation, Armonk, N.Y.

[21] Appl. No.: 406,652

[22] Filed: Sep. 13, 1989

[30] Foreign Application Priority Data

Mar. 10, 1988 [EP] European Pat. Off. ........ 88116352.1

[51] Int. Cl.⁵ ............................................. C23C 14/00
[52] U.S. Cl. ..................... 118/730; 118/500
[58] Field of Search ................................ 118/730, 500

[56] References Cited

U.S. PATENT DOCUMENTS

| 3,598,083 | 8/1971 | Dort | 118/730 |
| 3,783,822 | 1/1974 | Wollam | 118/730 |
| 3,853,091 | 12/1974 | Christensen | 118/730 |
| 4,284,033 | 8/1981 | del Rio | 118/730 |
| 4,777,908 | 10/1988 | Temple | 118/719 |

FOREIGN PATENT DOCUMENTS

| 2298880 | 1/1975 | France . | |
| 6118132 | 1/1986 | Japan . | |
| 168E4112224 | 6/1986 | Japan . | |
| 117417 | 5/1988 | Japan | 118/730 |
| 133320 | 5/1989 | Japan | 118/730 |
| 2191335 | 12/1987 | United Kingdom . | |

OTHER PUBLICATIONS

IBM TDB vol. 21, No. 6, Nov. 1978, pp. 2419-2420, Planetary Rotation Etching Wheel.
IBM TDB vol. 29, No. 4, Sep. 1986, pp. 1805-1806, Planetary Motion Fixture Plate for Thin Film Deposition.
IBM TDB vol. 16, No. 9, Feb. 1974, pp. 2865-2868, Planetary Evaporation System Having Multiple Rotations.

Primary Examiner—Richard Bueker
Attorney, Agent, or Firm—Donald M. Boles

[57] ABSTRACT

A method and apparatus for maintaining orientation of a wafer with respect to the wafer holder and a source emission is disclosed.

Briefly stated, a wafer is disposed on a wafer holder and displaced in translation only while made to continuously follow a planar closed path which allows the rotation of the wafer with respect to source of emission while keeping the wafer and the wafer holder uniformly aligned with respect to each other.

14 Claims, 6 Drawing Sheets

WAFER HOLDER METHOD AND APPARATUS IN A VACUUM DEPOSITION SYSTEM

BACKGROUND OF THE INVENTION

1. Field of the Invention

The present invention relates to an improved method for the angled exposure of at least one surface portion of a substrate to an emission of a source so as to form on the surface portion a layer having selected predetermined properties.

Another aspect of the present invention relates to an improved device in a system for the angled exposure of at least one surface portion of a substrate supported on a substrate holder to an emission of a source impinging obliquely on the surface portion, the device moving the substrate holder so as to improve the uniformity of the emission received on the surface portion.

Still another aspect of the present invention relates to semiconductor wafers having a multiplicity of laser mirror facets formed thereon, parallel to each other and exposed to the emission of a source according to the method of the invention. In an alternative, the present invention relates to semiconductor wafers having two sets of laser mirror facets, each set consisting of a multiplicity of facets formed on the wafer parallel to each other. The facets of the sets are parallel to each other and respectively facing each other and are exposed to the emission of a source independently of each other.

2. Related Art

A variety of deposition and other related exposure methods and systems are known in the art to provide for movement of the substrate holder so as to improve uniformity, thickness, etc. of the resulting surface layers on exposed surfaces. Such known methods and systems have not been specifically developed with a view to perform angled exposure within a closed vessel, and they are not suitable in that they fail to maintain the orientation of the substrate holder with respect to the source while the substrate holder is moved. Further, they do not allow angled exposure to be performed differently on different surfaces of one and the same substrate.

Representative of this known art are the devices disclosed by: L. Nowakowski in IBM Technical Disclosure Bulletin Vol. 29, No. 4 (September 1986) pp. 1805-6, in which the substrate is moved along an orbital path with a superposed planetary movement by means of a driving mechanism comprised of a stationary pinwheel and a sprocket engaging with and orbiting around the pinwheel J. A. Horton and R. P. King in IBM Technical Disclosure Bulletin Vol. 21, No. 6 (November 1978) pp. 2419-20 moves the substrate along an orbital path with a superposed planetary movement by means of a driving mechanism having three revolving parts to provide for a simple relation between the respective angles of rotation for orbital and planetary movement. M. S. Lee in IBM Technical Disclosure Bulletin Vol. 16, No. 9 (February 1974) pp. 2865-8, discusses results obtainable with a system such as this having three revolving parts geared in succession by order of decreasing radii.

None of this prior art however is capable of providing a movement compatible with the angled exposure of laser mirror surfaces of the type disclosed by K. Iga, Y. Mori and Y. Kotaki in Bull. P.M.E. (T.I.T.) No. 58 (September 1986) pp. 17-19 [published by Research Laboratory of Precision Machinery and Electronics, Tokyo Institute of Technology], that is, angled sputtering on each side of a groove etched in a semiconductor wafer. Thus, none of this prior art is capable of improving the uniformity of such angled exposure.

OBJECT OF THE INVENTION

Accordingly, it is an object of the invention to provide an improved method for the angled exposure of at least one surface portion of a substrate to an emission of a source so as to form a layer having selected predetermined properties. The surface portion of the substrate is continuously exposed to the emission impinging obliquely on the surface portion. A substrate holder is provided for supporting the substrate while the substrate holder is moved together with the substrate supported thereon while the angled exposure is performed, so as to improve the uniformity of properties of the formed layer.

A further object of the invention is to provide an improved apparatus for moving the substrate holder in order to improve the uniformity of the emission received on a surface.

SUMMARY OF THE INVENTION

These objects and others, which will become apparent from the description which follows, are attained according to the invention by improving prior methods in that the substrate holder is moved while its orientation with respect to the source is maintained. Preferably, the substrate holder is displaced in translation only while continuously following a plane closed path. Therefore, the angled exposure is performed with the emission impinging on at least one surface portion of the substrate in an essentially constant direction with respect to substrate-bound coordinates.

Also, the objects of the invention are attained in the aforesaid system by the provision of a means for driving the substrate holder so as to displace it in translation only while making it continuously follow a plane closed path.

The device for moving the substrate holder in the system is preferably comprised of a first shaft supported at a base element of the angled exposure system and journaled for rotation therein. A means for driving the first shaft in rotation is provided while a supporting structure is fixedly supported at the first shaft. A second shaft parallel to the first shaft and having the substrate holder affixable thereto is supported at the supporting structure and journaled for rotation therein. A first wheel is supported at the base element of the angled exposure system coaxial to the first shaft. A stop mechanism is used to maintain the first wheel in a predetermined angular position with respect to the base element. A second wheel mechanism is fixedly supported at the second shaft and is coaxial thereto. The first and second wheel mechanisms are coupled together for imparting to the second shaft a rotation opposite to the rotation of the first shaft.

In one particular embodiment of the device, the first and second wheel mechanisms are gear-wheels (gear) having equal numbers of cogs. The means for coupling together the first and second gear is a third gear-wheel (gear) fixedly supported at a third shaft coaxial thereto which is itself supported at the supporting structure and journaled for rotation therein. The third gear is geared to drive both the first and second gears.

In another embodiment of the device, the first and second wheel mechanisms are gear-wheels (gears) having respective first and second numbers of cogs. The means for coupling together the first and second gears is comprised of third and fourth gears having a respective third and fourth number of cogs. Both the third and fourth gears are fixedly supported at a common third shaft coaxial therefor which is itself supported at the supporting structure and journaled for rotation therein. The third gear is coacts with the first gear and the fourth gear coacts with the second gear. The ratio of the first number of cogs to the second number of cogs is equal to the ratio of the third number of cogs to the fourth number of cogs.

In still another embodiment of the device, the first and second wheel mechanisms are notched belt-pulleys having respective first and second notched grooves with an equal respective numbers of notches. The means for coupling together the first and second notched belt-pulleys is a notched belt supported at and driving both the first and second notched grooves.

In a further embodiment of the invention, the first wheel mechanism is supported for idler rotation at the base element of the angled exposure system. The stop mechanism is comprised of an idler stop element arranged at the first wheel mechanism in fixed relationship thereto. A fixed stop element is arranged at the base element in fixed relationship thereto. The idler stop element is adapted to abut the fixed stop element upon rotation of the first wheel mechanism so as to stop the idler rotation thereof.

Preferably, the idler stop element is adapted to abut the fixed stop element at two diametrically opposite angular positions of the first wheel mechanism. The fixed stop element may be a peg affixed to the base element with its axis parallel to the first shaft. Alternately, the fixed stop element may be a peg affixed to a peg supporting element with its axis parallel to the first shaft, in which case the peg supporting element is supported at the base element and journaled for rotation therein coaxial to the first shaft. An adjustment mechanism is provided for rotating the peg supporting element with respect to the base element in order to move the peg along an arc centered coaxial to the first shaft for adjustment of the orientation of the at least one surface portion of the substrate. Further, a friction device may be provided to generate friction between the first shaft and at least one of a group of elements comprised of the first wheel mechanism, the idler stop element and a means for fixing the idler stop element to the first wheel mechanism. The first wheel mechanism may be supported at the base element by use of the first shaft.

The method according to the invention, preferably when implemented with the device according to the invention, allows for exposure of surface of a wafer to the emission of a source in a manner which improves the homogeneity of the emission received on the surface. The direction from which the emission is received is maintained constant with respect to the surface.

Additionally, the method according to the invention, also allows for exposure of two sets of surfaces in succession and independently of each other to the emission of a source within a closed vessel, e.g. for vacuum coating, ion etching, radiation polymerization etc. No access to or manipulation of the substrate or substrate holder is required between the two exposures. Further, there is no need to return the vessel to ambient atmosphere and conditions in order to allow for re-orienting of the substrate with respect to the source.

Thus, the invention allows the coating of two sets of etched laser mirror surfaces on semiconductor wafers e.g. for passivation or modification of the reflectivity thereof. After the semiconductor substrate has been placed in a vacuum coating vessel, all mirrors of one set (e.g. all front mirrors) can be coated simultaneously and independently of all mirrors of the other set (e.g. of all rear mirrors), without the vessel being reopened. Upon reversal of the direction of rotation of the substrate holder, the substrate is rotated by 180° to respectively expose one or the other set of mirrors to the emission of the source.

DESCRIPTION OF THE DRAWINGS

The invention will be described in closer detail in the following with reference to the accompanying drawings wherein.

DETAILED DESCRIPTION OF THE PREFERRED EMBODIMENT

Figure 1:
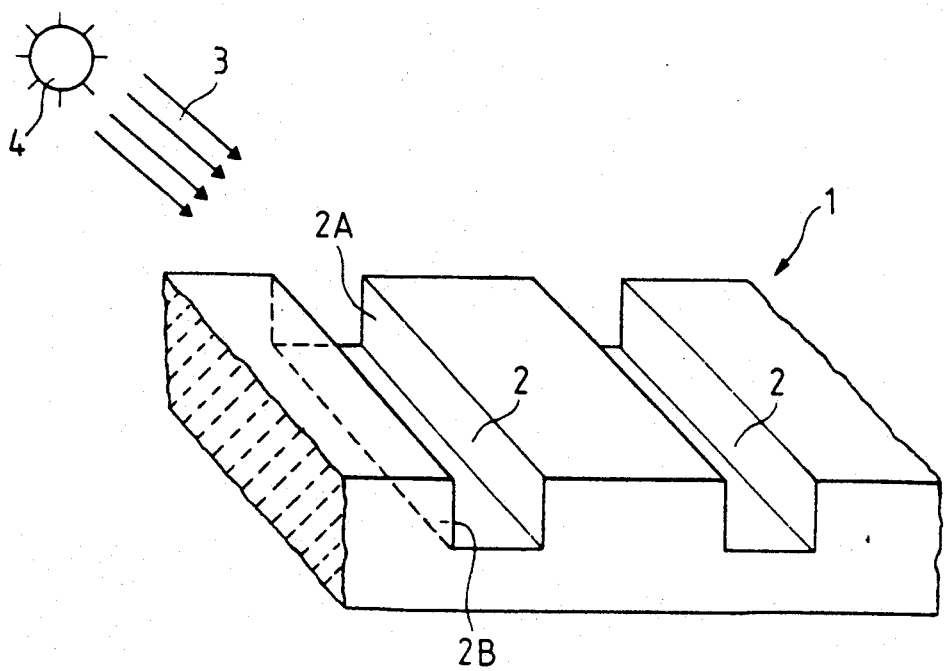
FIG. 1 schematically illustrates a semiconductor wafer having facets to be exposed to the emission of a source according to the method of the invention.
Figure 2:
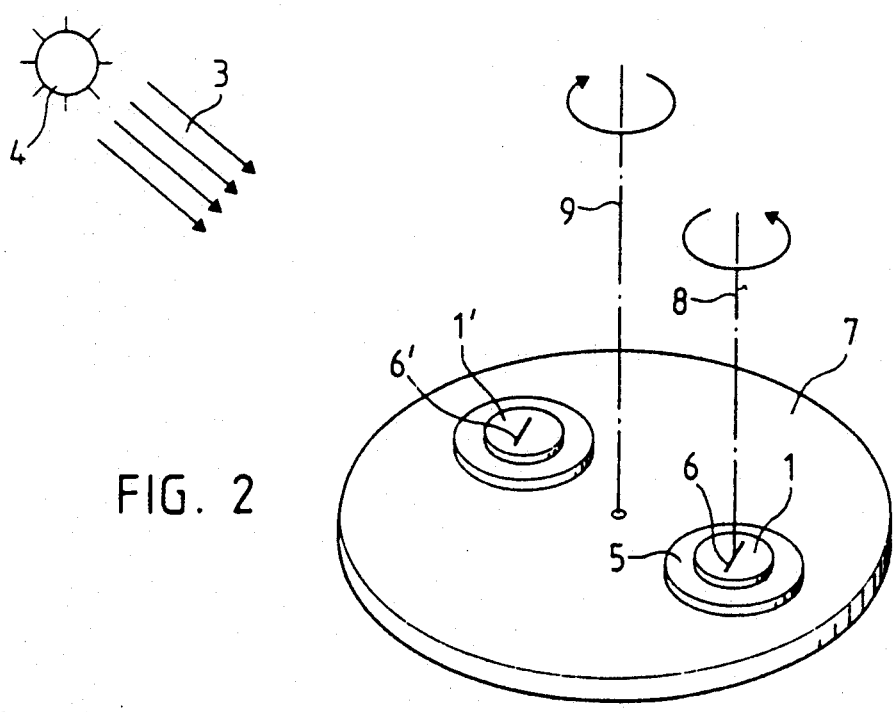
FIG. 2 schematically illustrates the principle of a system for performing the method of the invention on surface portions of a substrate such as the semiconductor wafer illustrated in FIG. 1.

Referring to FIG. 1A, an overall view showing exposure of a wafer may be seen. There a substrate 1 consisting of a semiconductor wafer has a multiplicity of surface portions 2 formed thereon for instance by etching so as to constitute laser mirror facets. These surface portions or facets 2 are parallel to each other and form two sets 2A, 2B in such manner that all facets of set 2A are facing in one direction, all facets of set 2B are facing in the opposite direction, and the facets of the one and the other set are facing each other in pairs. As shown in FIG. 2 the facets of set 2A are exposed to the emission 3 of a source 4, for coating facets 2A with a layer having selected predetermined properties such as a predetermined thickness and reflectivity. In order to form this coating, emission 3 impinges obliquely on the surface of facets 2A, and the distance between source 4 and substrate 1 is sufficient to ensure that all facets 2A are receiving emission 3 essentially under the same angle of, for example 45°.

However, in practice the emission of the source is not uniform enough to result in a constant received stream on all areas of facets 2A. Further, the distance between source 4 and surface portions 2 cannot be made large enough to result in a sufficiently constant receiving angle on all facets 2A. For these reasons, the substrate must be moved so as to improve the uniformity of the layer formed on such surface portions exposed to the emission. This movement however is subject to the requirement that the orientation of the substrate with respect to the source be maintained so that any variations of received intensity and receiving angle are averaged over various positions of the substrate, resulting in a constant average exposure of all facets 2A.

After facets of set 2A have been exposed to emission 3 of source 4, it is desirable to also expose the facets of the remaining set 2B to emission 3 after having changed some conditions such as for instance the duration of exposure. As a matter of illustration, when exposure is effected in a vacuum vessel for the purpose of coating laser mirror facets, it may be desired to coat facets 2A with a fully reflecting layer while facets 2B are coated with a partly reflecting layer. This allows for extraction of the laser beam from the semiconductor material. When this is done, it is desirable that these coatings be performed in succession independently of each other and without breaking the vacuum for any reason such as re-orienting substrate 1. In other operations, exposure may be effected for the purpose of etching by ion bombardment the exposed surface portions, or in order to cure or polymerize, by radiation of a layer provided thereon. In each such instance, exposure of the facets of second set 2B is performed subsequent to the exposure of the facets of first set 2A. It is, however, desirable that these successive exposures be performed independently of each other in one single batch operation within a closed vessel so that there is no need to return to ambient atmosphere and conditions e.g. to allow for re-orienting the substrate with respect to the source.

In FIG. 2 the principle of a system for performing the method of the invention is schematically illustrated. Substrate 1 is placed and supported on a substrate holder 5 and may be affixed thereto if need be. The longitudinal direction of facets 2 of FIG. 1 is marked as line 6 on substrate 1. Substrate holder 5 is placed with respect to source 4 so as to allow angled exposure of one set of facets 2 of FIG. 1 to emission 3 of source 4. Thus, a surface portion of substrate 1 consisting of facets 2A is continuously exposed to emission 3, impinging obliquely on facets 2A.

In the embodiment shown in FIG. 2, substrate holder 5 is formed as a horizontal disk and nested with play in a corresponding circular aperture (not shown) of a horizontal baffle disk 7. It is to be understood that the provision of the baffle disk 7 is optional and serves to protect parts and areas against undesired exposure to emissions. Accordingly, baffle disk 7 is used for illustration purposes only. Horizontal disposition of the plane of substrate holder 5 is optional and is shown for illustration purposes only.

Substrate holder 5 has a vertical axis of rotation 8 while baffle disk 7 has a vertical axis of rotation 9. When exposure of substrate 1 to emission 3 is performed, baffle disk 7 is continuously rotated about its axis 9, so that axis 8 of substrate holder 5 is continuously moved around axis 9. Substrate 1 continuously accompanies this movement, its center continuously following a circular orbit around axis 9. Eventually, substrate 1 will reach some instant position referenced 1'.

According to the method of the invention, the movement of substrate holder 5 (and of substrate 1 supported thereon) is such that its orientation with respect to the source is maintained. In other words, the direction of mark line 6 remains constant, so that mark line 6 of substrate 1 is parallel to mark line 6' at any instant position 1' of substrate 1. As illustrated in FIG. 2, when performing angled exposure with the emission impinging on exposed surface portion 2 of substrate 1, substrate holder 5 and substrate 1 supported thereon are displaced in translation only while made to continuously follow a planar circular path.

It is to be understood that the embodiment described with reference to FIG. 2 is applicable to the case where the source is located at a substantially greater distance from axis 9 than the distance from axis 8 to axis 9. Therefore, this embodiment is applicable when an orthogonal projection of source 4 on the plane of baffle disk 7 is located radially outside any possible position 1' of substrate 1 with respect to axis 9 and preferably far outside baffle disk 7. However, the source may be located nearer to axis 9 than the distance from axis 8 to axis 9.

Accordingly, when an orthogonal projection of source 4 on the plane of baffle disk 7 is located nearer to axis 9 than any possible position 1' of substrate 1, the present teaching remains valid in that it prescribes to move the substrate holder while maintaining its orientation with respect to the source. Therefore, substrate holder 5 and substrate 1 supported thereon are made to orbit around axis 9 in a manner similar to the moon orbiting around the earth.

Figure 4:
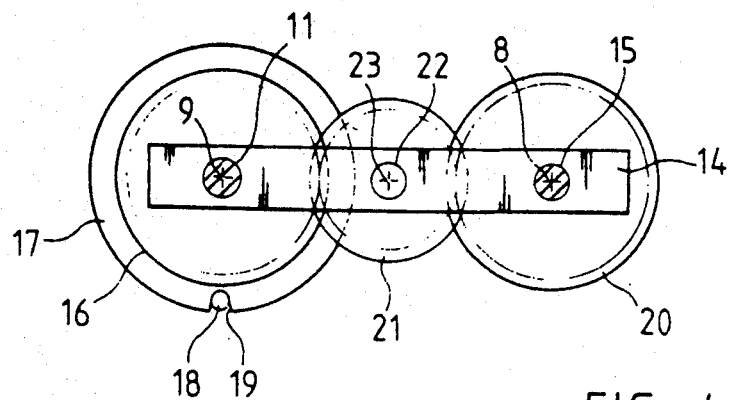
FIG. 4 is a schematic plan view of the driving mechanism and the stop means taken in the direction of 4-4 of FIG. 3.
Figure 3:
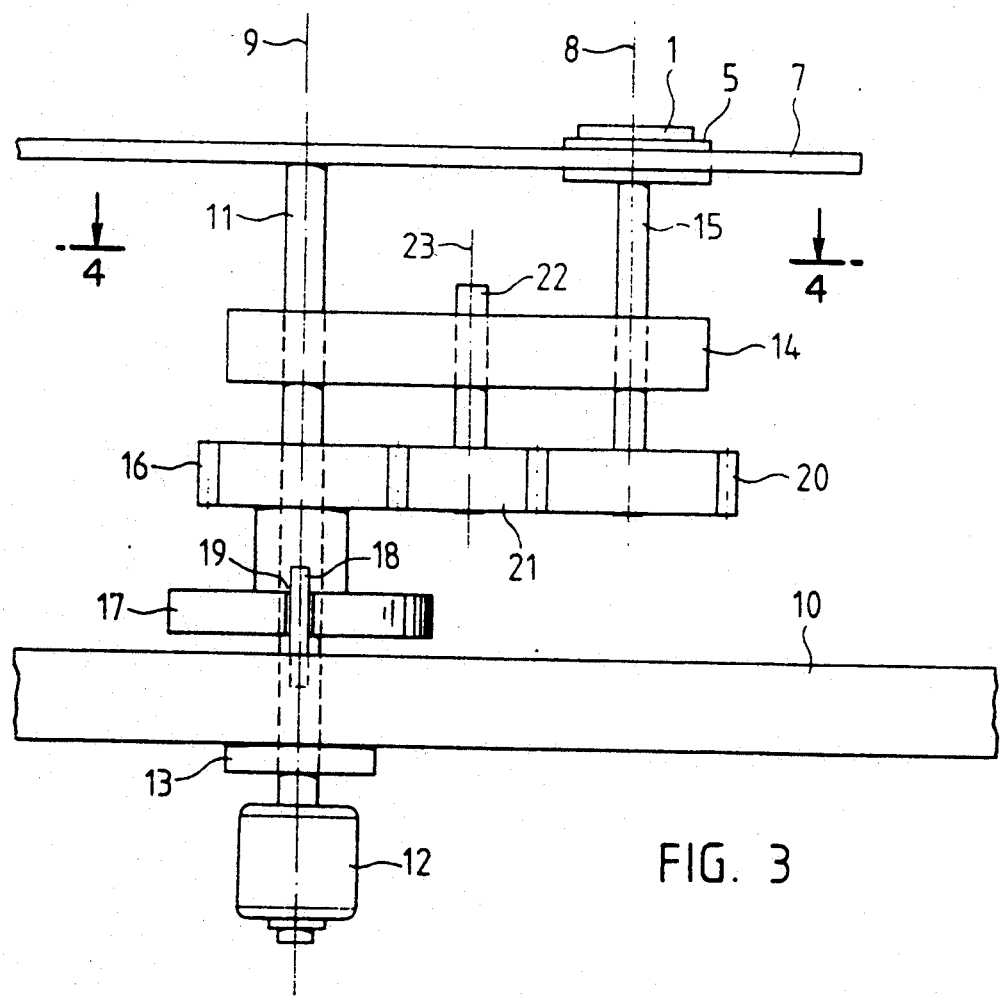
FIG. 3 is a schematic front view of a driving mechanism and of a stop means according to the invention.
Figure 5:
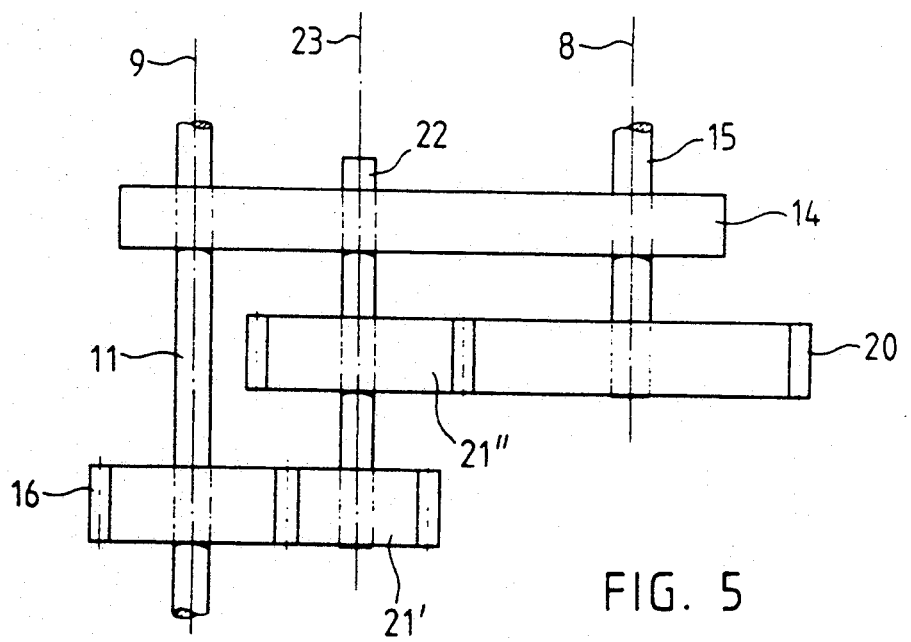
FIG. 5 is a schematic front view of another embodiment of the driving mechanism.

Referring now to FIGS. 3, 4 and 5, an embodiment of a driving mechanism and a stop means according to the invention are illustrated. A base element 10 is provided to support the apparatus shown and is within a closed vessel (not shown) so that vacuum coating, ion etching, radiation polymerization or similar processes using angled exposure may be performed. A first shaft 11 is supported at base element 10 and journaled for rotation therein. First shaft 11 may be driven in rotation by a driving means 12 such as an electric motor located outside the vessel, e.g. at the outside end of shaft 11. In the instance described, base element 10 is formed as a flange mounted sealed at an aperture of the wall of the vessel and provided with a rotary seal 13 for first shaft 11. Baffle disk 7 is supported at an inside end of first shaft 11 coaxial thereto, whereby axis 9 of baffle disk 7 constitutes the axis of first shaft 11.

A supporting structure 14 which may be generally prismatic shaped such as a beam is fixedly supported at shaft 11. A second shaft 15 is provided parallel to shaft 11 and spaced therefrom, supported at beam 14 and journaled for rotation therein in the vicinity of one end of shaft 15. At its other end, shaft 15 supports substrate holder 5 affixed coaxial thereto, whereby axis 8 of substrate holder 5 constitutes the axis of shaft 15.

Coaxial to first shaft 11 there is provided a first wheel formed as a first gear-wheel (gear) 16 supported at base element 10. Although gear 16 can be fixed directly onto base element 10 in order to facilitate mounting and dismounting operations for cleaning purposes, gear 16 is preferably journaled for rotation in shaft 11 and fixed with respect to base element 10 by a stop in order to maintain it in a predetermined angular position. In the embodiment illustrated, the stop is comprised of a disk 17 coaxial to gear 16 and affixed thereto. A peg 18 is affixed to base element 10 and engages disk 17 in a corresponding aperture 19. Disk 17 rotates together with gear 16, and hence idler rotation of disk 17 on shaft 11 is accomplished by disk 17 being axially spaced from or journaled for idler rotation in shaft 11.

At the end of second shaft 15 located in vicinity of supporting structure 14 there is provided a second wheel formed as a second gear-wheel (gear) 20 coaxial to and fixedly supported at second shaft 15. Thus, substrate holder 8 and gear 20 are supported at and rotate together with second shaft 15 in support structure 14. In the embodiment of FIGS. 3 and 4, gears 16 and 20 have an equal number of cogs.

To impart to shaft 15 a rotation of equal angular velocity opposite to the rotation of shaft 11, there is provided a means for coupling together gears 16 and 20. This is formed by a third gear-wheel (gear) 21 fixedly supported in the vicinity of one end of a third shaft 22 coaxial thereto. The other end of shaft 22 is supported at beam 14 and journaled for rotation therein about axis 23. Axis 23 is located in the plane of axis 8 and 9 and equidistant therefrom. Gear 21 coacts with first and second gears 16 and 20.

Upon rotation of shaft 11 in base element 10, first gear 16 remains stationary in that peg 18 prevents disk 17 from rotating. However, beam 14 and the elements supported thereon rotate with first shaft 11. Thus, third gear 21 is moved about first gear 16 in an orbiting movement, which movement imparts to third gear 21 a corresponding rotation about its axis 23. This rotation in turn imparts a rotation to second gear 20. It will be apparent that regardless of whether gear 21 has the same or a different number of cogs than first and second gears 16, 20, first shift 11 and second gear 20 on second shaft 15 will always rotate opposite to each other with equal angular velocity. Thus, second shaft 15 is moved about first shaft 11 in an orbiting movement comprised of translation only. This therefore results in substrate holder 5 maintaining its orientation in space and particularly with respect to the source as shown in FIG. 2.

It will also be apparent that first and second gears 16, 20 need not be located opposite each other but may be staggered as shown in FIG. 5. In this case, third gear 21 is comprised of two parts 21' and 21" each coaxial to and fixedly supported at third shaft 22. Part 21' acts as third gear coacting with first gear 16. Part 21" acts as a fourth gear, coacting with second gear 20. Parts 21' and 21" are both fixedly supported at common third shaft 22 which is coaxial thereto. Third shaft 22 is supported at the supporting structure 14 and journaled for rotation therein.

Figure 6:
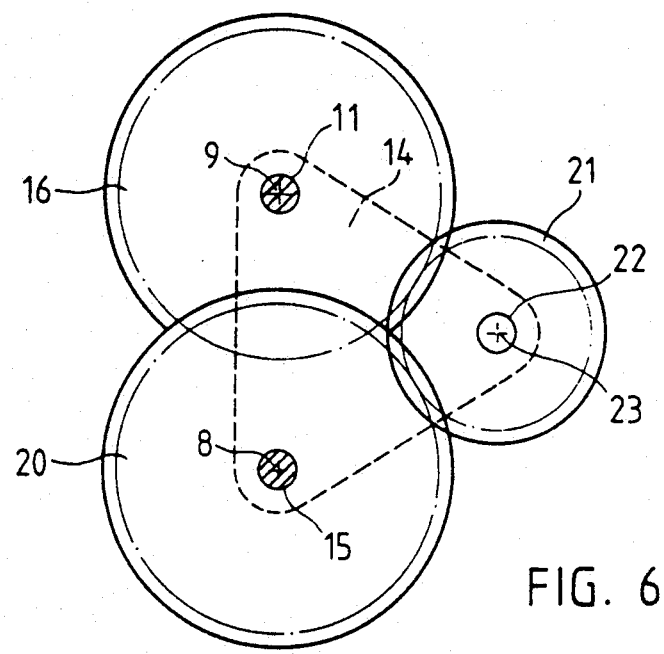
FIG. 6 is a schematic plan view of a modification of the driving mechanism of FIG. 5.

By placing first and second gears 16, 20 in staggered arrangement allows them to overlap each other, as shown in FIG. 6. This results in substrate holder 5 being placed nearer to its orbit axis 9 than the embodiment illustrated in FIGS. 3 and 4.

Parts 21' and 21" of third gear 21 may have an equal number of cogs, such that they function together as the single gear 21 of FIGS. 3 and 4. However, as shown in FIG. 6, the two parts 21' and 21" may be merged to form a single gear 21 of sufficient axial length so as to allow it to be in proper gearing engagement with first and second gears 16, 20.

An advantage to placing first and second gear 16, 20 in staggered arrangement is to allow the use of a different number of cogs. Therefore, in order to impart to shaft 15 a rotation of equal angular velocity but opposite to the rotation of first shaft 11, part 1' (acting as a third gear) and part 21" (acting as a fourth gear) will each have a respective third and fourth number of cogs such that the ratio of the first number of cogs (of gear 16) to the second number of cogs (of gear 20) is equal to the ratio of the third number of cogs (of part 21') to the fourth number of cogs (of part 21").

It is to be understood that the gears and their gearing engagement may be substituted with friction wheels in respective friction engagement. Thus, in one alternative embodiment (not shown), the first and second wheels may be friction wheels having equal diameters. Accordingly, the means for coupling together the first and second friction wheels would be a third friction wheel fixedly supported at a third shaft which is coaxial thereto and is itself supported at the supporting structure and journaled for rotation therein. The third friction wheel would be in frictional engagement with both the first and second friction wheels.

In another alternative embodiment (not shown) the first and second wheels are friction wheels having respective first and second diameters. The means for coupling together the first and second friction wheels would be comprised of third and fourth friction wheels having a respective third and fourth diameter. Both the third and fourth friction wheels would be fixedly supported at a common third shaft which is coaxial thereto and is itself supported at the supporting structure and journaled for rotation therein. The third friction wheel would be in frictional engagement with the first wheel while the fourth wheel would coact with the second wheel. The ratio of the first diameter to the second diameter would be equal to the ratio of the third diameter to the fourth diameter.

Figure 7:
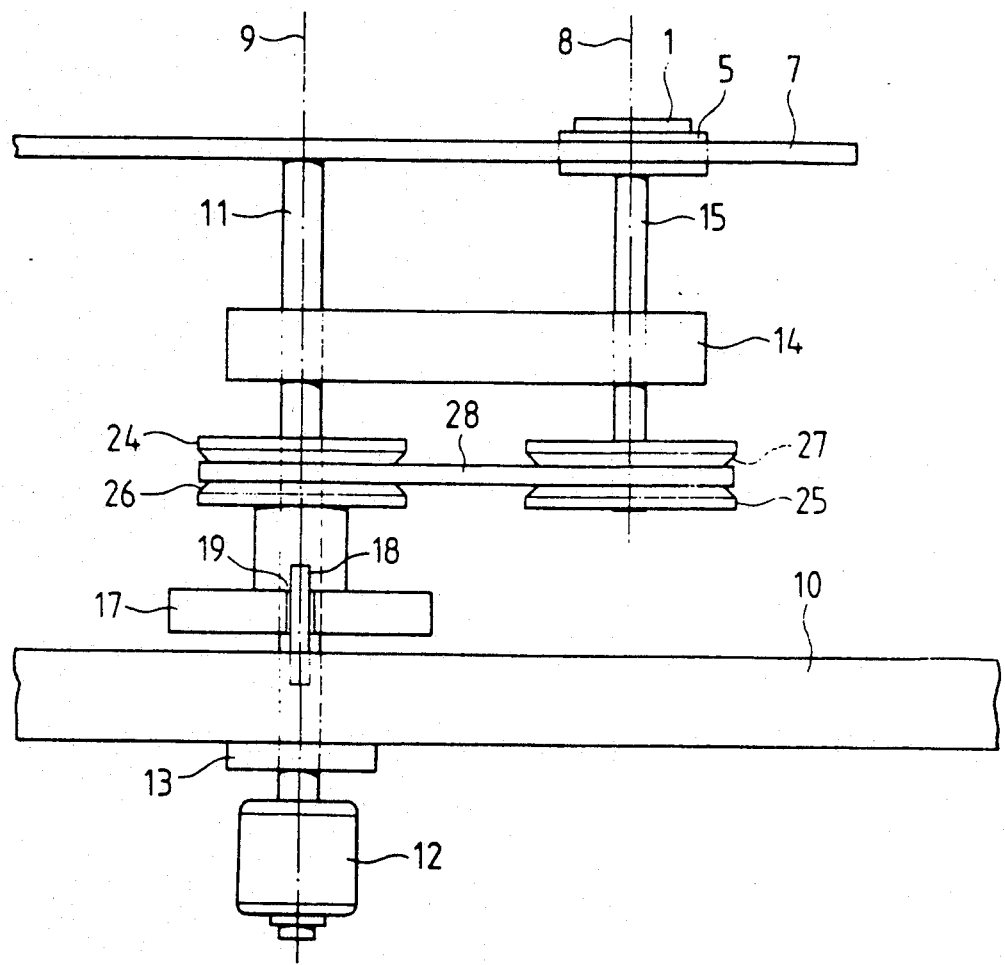
FIG. 7 is a schematic front view of still another embodiment of the driving mechanism.

Referring to FIG. 7 there is schematically illustrated another alternate embodiment wherein the first and second wheels are formed as respective notched belt-pulleys 24, 25 each having a respective notched groove 26, 27. The means for coupling together notched belt-pulleys 24, 25 is a notched belt 28 supported at notched belt-pulleys 24, 25 coacting with respective notched grooves 26, 27. In order to impart to shaft 15 a rotation of equal angular velocity opposite to the rotation of shaft 11, the transmission ratio must be 1:1, i.e. notched grooves 26, 27 have an equal number of notches.

Figure 9:
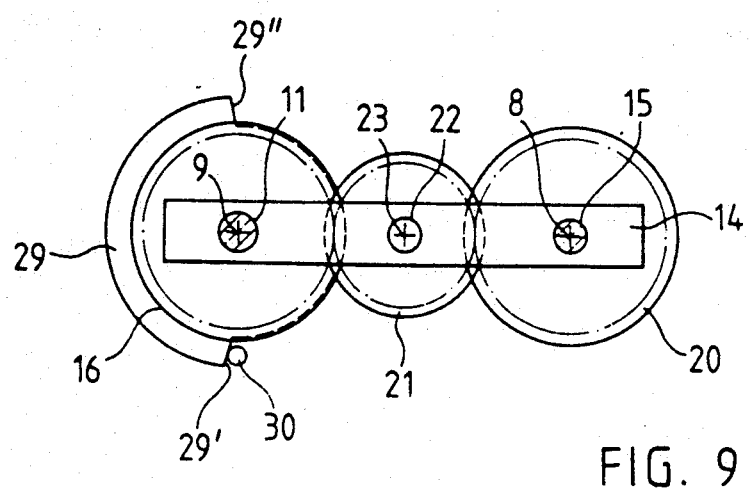
FIG. 9 is a schematic plan view of the stop means of FIG. 8.
Figure 8:
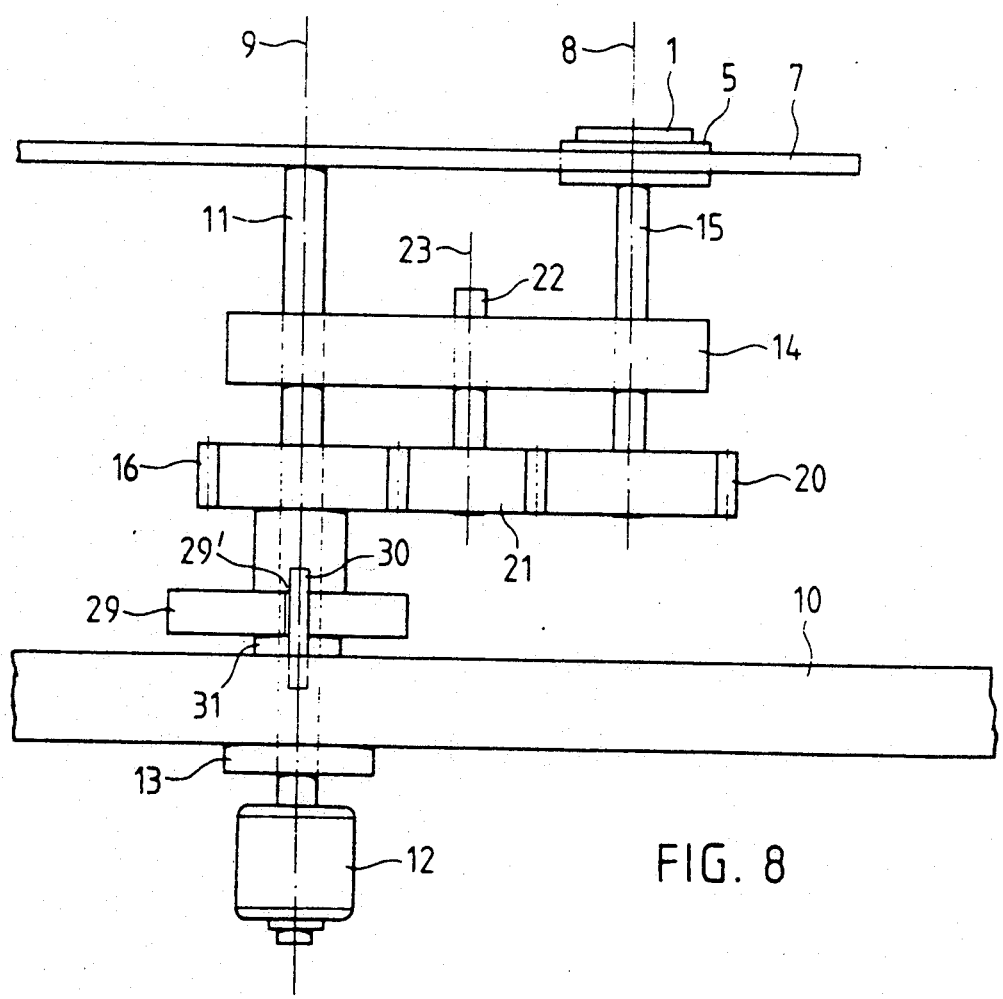
FIG. 8 is a schematic front view of the driving mechanism of FIG. 3 combined with another embodiment of the stop means.

Referring to FIGS. 8 and 9 another alternate embodiment is shown. Here, the first wheel is formed as a first gear-wheel 16 and is supported for idler rotation at base element 10. The stop is comprised of an idler stop element and a fixed stop element. The idler stop element is a cam disk 29 arranged at first gear 16 in fixed relationship thereto, in a manner similar to the arrangement of disk 17 being affixed to first gear 16 (FIGS. 3 and 4). The fixed stop element is formed as a peg 30 affixed to base element 10 and is a cylindrical peg arranged with its axis parallel to axis 9 of first shaft 11. Cam disk 29 has cam ramps 29', 29" adapted to be abutted by peg 30 upon rotation of cam disk 29 so as to limit the idler rotation between two abutment positions thereof. These two abutment positions correspond to two diametrically opposite angular positions of cam disk 29 and therefore first gear 16.

Between its two abutment positions, cam disk 29 is adapted to accompany the rotation of shaft 11. To attain this, the group of elements comprised of gear 16, cam disk 29 and the mechanism for fixing cam disk 29 to gear-wheel 16 (not shown) can be supported at base element 10 by use of first shaft 11. Here, the residual friction at the journal for idler rotation of this group of elements will provide for the desired accompanying rotation.

In FIG. 8, a collar 31 is affixed at first gear 16 to enclose first shaft 11 which is coaxial thereto and to provide controlled friction. However, it is to be understood that an alternate or equivalent use or a friction device may be used such as a leaf spring affixed first at gear-wheel 16 and arranged for frictional engagement with first shaft 11. The leaf spring would be affixed at cam disk 29 or at the means (not shown) for fixing cam disk 29 to gear-wheel 16.

Apparent is when first shaft 11 is rotated in one direction, cam disk 29 accompanies this rotation until it reaches the corresponding abutment position. During this rotation of cam disk 29, second shaft 15 does not rotate about its own axis 8 because no relative movement is taking place between supporting structure 14 and gear-wheel 16. Thus, substrate holder 5 is rotated by the same angle as first shaft 11 until cam disk 29 reaches the corresponding abutment position (and vice versa for the other direction of rotation of first shaft 11). Thus, provided that first shaft 11 is rotated in succession in one and then the other direction by more than 180°, changing the sense of rotation of first shaft 11 results in the orientation of substrate holder 5 being turned by a corresponding angular change.

Accordingly the present device is capable of exposing mirror facets of a wafer to the emission of a source in succession and independently of each facet.

Figure 10:
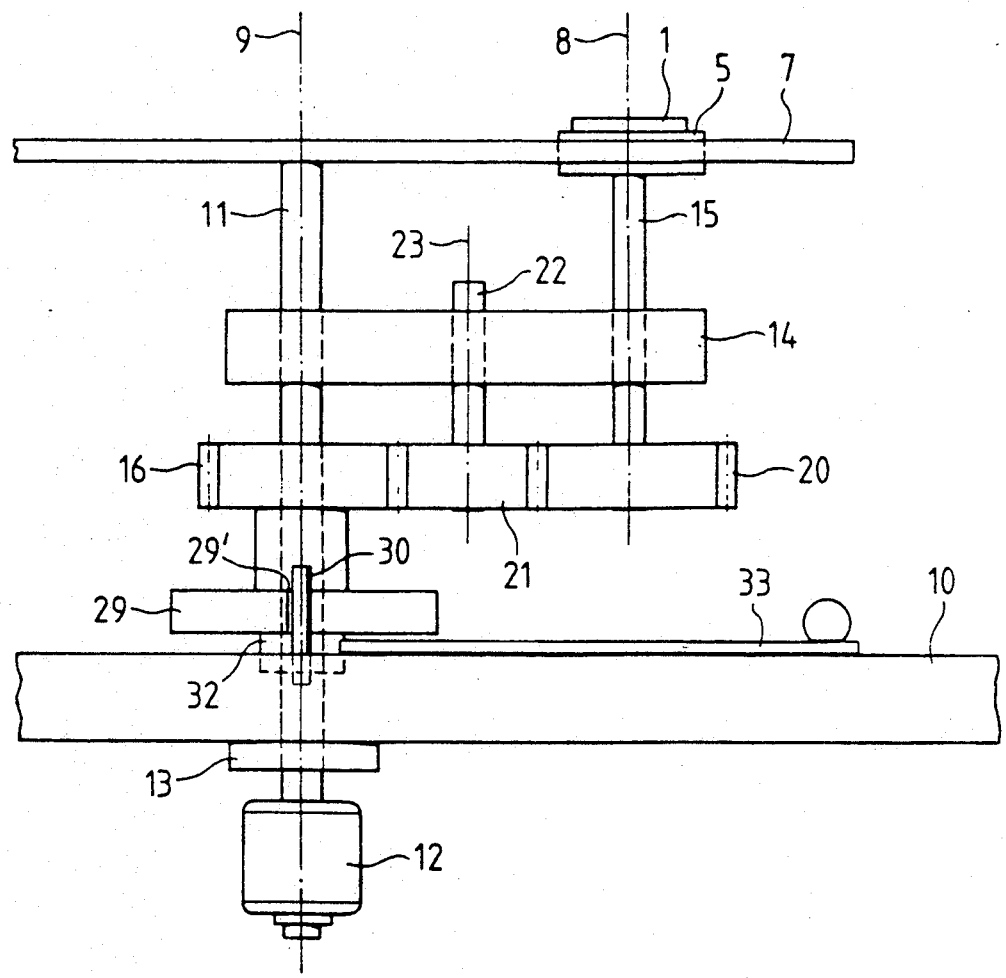
FIG. 10 is a schematic front view of the driving mechanism of FIG. 3 combined with a variant of the embodiment of the stop means of FIG. 8.

A variant of this invention is illustrated in FIG. 10 wherein the fixed stop element is formed as a cylindrical peg 30 affixed to a peg supporting element comprised of a peg carrier disk 32 which is itself supported at base element 10 and journaled for rotation coaxial to first shaft 11. Peg 30 is arranged at peg carrier disk 32 with its axis parallel to and spaced from axis 9 of first shaft 11. An adjusting mechanism is provided in the form of a lever 33, for rotating peg carrier disk 32 with respect to base element 10. This permits movement of peg 30 along an arc centered coaxial to axis 9 of first shaft 11. It is to be understood that this adjustment means can be accomplished by remote operation as for instance mechanically through base element 10 or electrically by use of a motor located on base element 10. This would therefore allow for adjustment of the orientation of substrate holder 5 in any desired direction in addition to turning substrate holder 5 by at least 180° as described above.

The embodiments of the invention described in the foregoing are to be regarded as examples only and other embodiments are possible within the scope of the appended claims.

We claim:

1. A device for uniformly exposing at least one surface portion of a substrate held by a substrate holder to an emission source, comprising:
   means for translational displacement of a substrate holder in a continuous planar closed path, said means comprised of;
   a base element;
   a first rotatable shaft supported by said base element;
   second means to rotate said first rotatable shaft;
   a second rotatable shaft parallel to said first rotatable shaft, said second rotatable shaft having a substrate holder attachable thereto;
   a first wheel coaxial to said first rotatable shaft;
   a second wheel coaxial to said second rotatable shaft; and
   third means coacting with said first and second wheel for imparting to said second rotatable shaft a rotation opposite to the rotation of said first rotatable shaft.

2. A device according to claim 1, wherein said substrate is comprised of a semiconductor wafer having two sets of laser mirror facets, each said set consisting of a plurality of facets formed on said semiconductor wafer and being parallel to each other, and respectively facing each other so as to be oriented and exposed to said emission so as to be exposed independently to each other.

3. A device according to claim 1 wherein said first and second wheels are gears having an equal number of cogs and wherein said third means is a third gear fixedly supported at a third rotatable shaft coaxial thereto.

4. A device according to claim 1 further comprising stop means adjacent said first wheel for maintaining said first wheel in a predetermined angular position with respect to said base element.

5. A device according to claim 1 wherein said first and said second wheels have respective first and second numbers of cogs and wherein said third means is comprised of third and fourth gears having respective third and fourth numbers of cogs and said third and fourth gears being fixedly supported at a common third rotatable shaft, wherein the third gear coacts with said geared first wheel and said fourth gear coacts with said geared second wheel wherein the ratio of said first number of cogs to said second number of cogs is equal to the ratio of said third number of cogs to said fourth number of cogs.

6. A device according to claim 2 wherein said first and said second wheels are notched pulleys and wherein said third means is a pulley belt.

7. A device according to claim 6 wherein said pulleys are notched such that said first and said second wheels have equal numbers of notches and wherein said pulley belt is notched for coacting with said notches on said first and second wheels.

8. A device according to claim 4 wherein said first wheel is supported for idler rotation by said base element and wherein said stop means is comprised of an idler stop element and a fixed stop element wherein said idler stop element is in fixed relationship with respect to said first wheel, and wherein said idler stop element is adapted to abut said fixed stop element upon rotation of said first wheel so as to prevent the idler rotation thereof.

9. A device according to claim 8 wherein said idler stop element is adapted to abut said fixed stop element at two diametrically opposite angular positions of said first wheel.

10. Device according to claim 9 further comprising friction means for generating friction between said first rotatable shaft and at least one of a group of elements comprised of said first wheel, said idler stop element, and means for abutting said idler stop element to said first wheel.

11. A device according to claim 9 wherein said first wheel is supported at said base element by said first rotatable shaft.

12. A device according to claim 9 wherein said fixed stop element is comprised of a peg fixed to said base element, said peg having its axis parallel to said first rotatable shaft.

13. A device according to claim 9 wherein said fixed stop element is comprised of a peg fixed to a peg supporting element, said peg having its axis parallel to said first rotatable shaft; said peg supporting element being supported by said base element and journaled for rotation therein coaxial to said first rotatable shaft and proximate said peg and further comprising adjustment means in coaction with said peg supporting element for rotating said peg supporting element with respect to said base element along an arc centered coaxial to said first rotatable shaft so as to adjust the orientation of the at least one surface portion of the substrate.

14. A device according to claim 1 wherein the substrate is comprised of a semiconductor wafer having a plurality of laser mirror facets formed thereon, said mirror facets being essentially parallel to each other.

* * * * *